(12) United States Patent
Dupart et al.

(10) Patent No.: US 10,091,895 B2
(45) Date of Patent: Oct. 2, 2018

(54) ACCESS CONTROL READER WITH AN OPENING DETECTION DEVICE

(71) Applicant: SYSTEMES ET TECHNOLOGIES IDENTIFICATION (STID), Greasque (FR)

(72) Inventors: Vincent Dupart, Saint-Maximin-la-Sainte-Beaume (FR); Jérôme Silve, Rousset (FR); Sylvain Poitrat, Greasque (FR)

(73) Assignee: SYSTEMES ET TECHNOLOGIES IDENTIFICATION (STID), Greasque (FR)

( * ) Notice: Subject to any disclaimer, the term of this patent is extended or adjusted under 35 U.S.C. 154(b) by 31 days.

(21) Appl. No.: 15/109,431

(22) PCT Filed: Jan. 5, 2015

(86) PCT No.: PCT/FR2015/050004
§ 371 (c)(1),
(2) Date: Jun. 30, 2016

(87) PCT Pub. No.: WO2015/104485
PCT Pub. Date: Jul. 16, 2015

(65) Prior Publication Data
US 2016/0338213 A1    Nov. 17, 2016

(30) Foreign Application Priority Data

Jan. 7, 2014 (FR) ...................................... 14 50087

(51) Int. Cl.
*H05K 5/00* (2006.01)
*H05K 5/02* (2006.01)
(Continued)

(52) U.S. Cl.
CPC ............ *H05K 5/0208* (2013.01); *G01P 15/18* (2013.01); *H05K 5/03* (2013.01)

(58) Field of Classification Search
CPC ........ H05K 5/028; H05K 5/03; H05K 5/0208; H05K 5/0247; H05K 5/0204; G01P 15/18; H02B 1/066; H02B 1/46
See application file for complete search history.

(56) References Cited

U.S. PATENT DOCUMENTS 4,595,115 A * 6/1986 Huynh ................. H05K 5/0221
220/3.8
4,791,244 A * 12/1988 Taybl ..................... H02B 1/066
174/542
(Continued)

FOREIGN PATENT DOCUMENTS

CH      495684 A    8/1970
DE      1616794 B1  9/1970
(Continued)

OTHER PUBLICATIONS

International Search Report dated Mar. 9, 2015 re: Application No. PCT/FR2015/050004, pp. 1-3, citing: EP 0 253 756 A2, US 2011/054830 A1, DE 197 46 118 A1, CH 495 684 A, DE 16 16 794 B1.
(Continued)

*Primary Examiner* — Helen Kwok
(74) *Attorney, Agent, or Firm* — Cantor Colburn LLP

(57) ABSTRACT

An access control reader includes a housing incorporating a base having a main wall designed to be secured to a support and a front part mounted on the base; a device detects opening of the housing. The reader is characterized in that the base and the front part include complementary guide components shaped so as to guide the front part in a tilting movement relative to the base when the housing is opened, from a closed configuration in which the front part is secured and folded down onto the base into an open configuration in
(Continued)

which the front part is spaced apart from the base and is inclined relative to the main wall at a predefined angle which is not zero. The detection device is mounted on the front part in order to detect the tilting movement thereof.

13 Claims, 4 Drawing Sheets

(51) Int. Cl.
*G01P 15/18* (2013.01)
*H05K 5/03* (2006.01)

(56) References Cited

U.S. PATENT DOCUMENTS

| | | | |
|---|---|---|---|
| 5,397,886 A * | 3/1995 | Mos | G06K 7/0004 235/440 |
| 5,711,587 A * | 1/1998 | Takahashi | E05C 1/14 312/223.6 |
| 6,123,401 A * | 9/2000 | Chiba | H04M 1/0216 16/332 |
| 2002/0121132 A1* | 9/2002 | Breed | B60C 11/24 73/146 |
| 2004/0042192 A1 | 3/2004 | Davidson et al. | |
| 2005/0204167 A1 | 9/2005 | Conlin et al. | |
| 2005/0207087 A1* | 9/2005 | Fisher | E05B 19/0005 361/160 |
| 2011/0054830 A1 | 3/2011 | Logan | |
| 2011/0202170 A1* | 8/2011 | Dawes | F25D 29/00 700/215 |
| 2013/0346168 A1* | 12/2013 | Zhou | G06F 1/163 705/14.4 |
| 2014/0090951 A1 | 4/2014 | Johnson et al. | |
| 2015/0145644 A1* | 5/2015 | Jalbert | A01K 5/02 340/5.61 |
| 2015/0325940 A1* | 11/2015 | Foseide | G06F 21/88 439/304 |
| 2015/0330140 A1* | 11/2015 | Kincaid | E06B 7/28 324/207.12 |

FOREIGN PATENT DOCUMENTS

| | | |
|---|---|---|
| DE | 19746118 A1 | 5/1999 |
| EP | 0253756 A2 | 1/1988 |
| EP | 0353443 A2 | 2/1990 |
| EP | 2487351 A1 | 8/2012 |
| FR | 2988871 A1 | 10/2013 |
| WO | 9627858 A1 | 9/1996 |
| WO | 9850876 A1 | 11/1998 |

OTHER PUBLICATIONS

International Search Report dated Mar. 9, 2015 re: Application No. PCT/FR2015/050005, pp. 1-3, citing: WO 96/27858 A1 and WO 98/50876 A1.

* cited by examiner

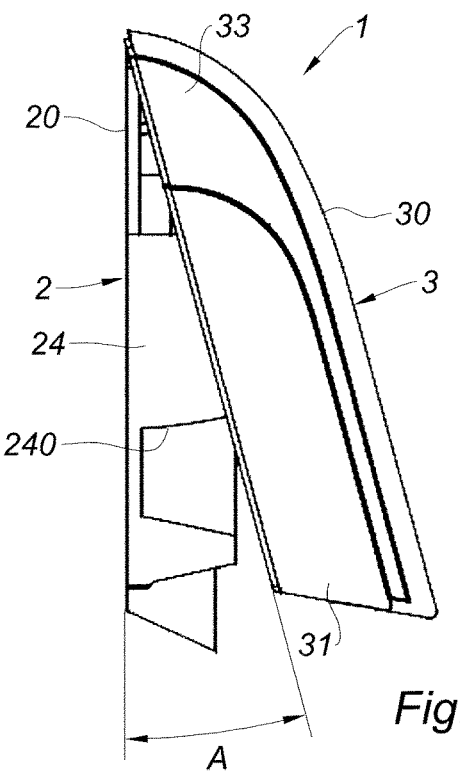
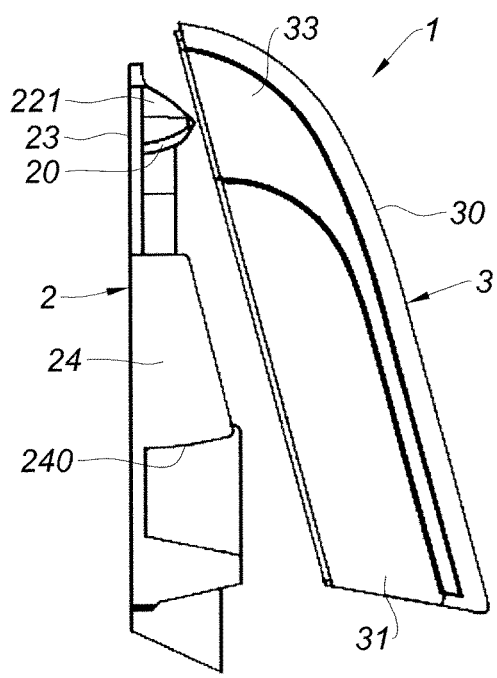
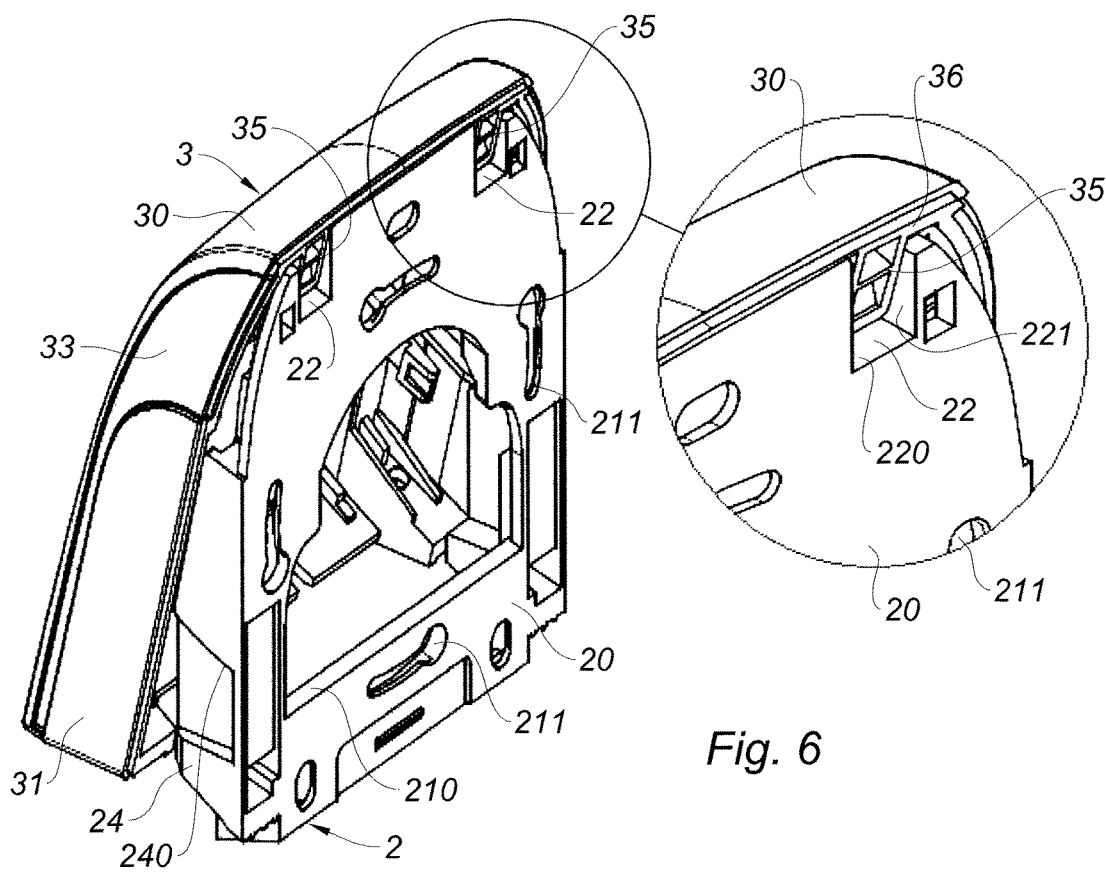

ACCESS CONTROL READER WITH AN OPENING DETECTION DEVICE

TECHNICAL FIELD

The present disclosure relates to an access control reader provided with an opening detection device. The disclosure further relates to an access control reader including a casing integrating a base presenting a main wall provided for a fixation on a support and a facade mounted on said base, and a device for detecting an opening of the casing.

BACKGROUND

Access control readers, or secure identification readers, are likely to be subject to vandalism or hacking acts consisting in opening the casing, by separating the facade from the base, in order for example to hack the electronics embedded inside of the casing which ensures the detection and the automated opening of a restricted access door.

To guard against such acts, it is known to provide for devices for detecting the opening of the casing, in order for example to emit an alarm and/or to disconnect the reader in order to make it unusable and/or to erase memorized data such as authentication keys.

Conventionally, the detection devices are of the type mechanical switch, generally infrared optical sensor, or magnetic sensor of the flexible-blade switch or reed switch type.

However, these detection devices prove to be easily circumventable, for example by inserting a blade between the facade and the base so as to maintain the contact on the mechanical switch, by inserting a reflecting blade between the facade and the base and in front of the optical sensor in order to form a decoy simulating the closed configuration of the casing, or by positioning a magnet proximate to the magnetic sensor in order to also simulate the closed configuration of the casing.

Furthermore, the detection device with a mechanical switch has other drawbacks, such as the wear of the parts, the complexity and the fragility of the mounting when closing the casing. The detection device with an optical sensor is, in turn, very energy-consuming, not to mention the complexity of the mounting which requires centering an element in front of the sensor. The detection device with a magnetic sensor is also complex to be mounted because it also requires centering a magnet in front of the sensor.

Finally, these detection devices are not able to detect a complete pull-off of the casing, facade and base included, in other words, a removal of the casing from his wall support without opening the casing, because the (mechanical, optical or magnetic) sensor is always comprised between the base and the facade.

It is also known from the document US 2011/0054830 to provide for a motion detection device integrating an accelerometer, this detection device being placed on existing objects (flap of a printer, door of an enclosure, tab of a box, . . . ), without suggesting any modification of the structure or the kinematics of the object. Although this detection device is interesting, it is however not enough to just directly place such a detection device, in order to address the problem of risk of falsification.

SUMMARY

The present disclosure aims to resolve all or part of the aforementioned drawbacks, by providing an access control reader which allows for a reliable and tamper-proof detection of the opening of the casing, and even of the complete pull-off of the casing.

To this end, the disclosure provides an access control reader comprising a casing integrating a base presenting a main wall provided for a fixation on a support and a facade mounted on said base, and a device for detecting an opening of the casing, said reader being remarkable in that the base and the facade include complementary guiding means shaped so as to guide the facade in a tilting motion relative to the base during the opening of the casing starting from a closed configuration in which the facade is fastened and folded over the base up to an open configuration in which the facade is spaced apart from the base and is inclined with respect to the main wall at a predefined non-zero angle, and in that the detection device is mounted on the facade to detect the tilting motion of said facade.

Thus, the disclosure aims to make mandatory a—substantially pivoting—tilting motion of the facade and a minimum inclination of the facade in order to be able to separate the facade from the base, and therefore open the casing, and it is this mechanically imposed tilting motion and this inclination of the facade which are detected by the detection device. In this manner, it is impossible to falsify the detection of the opening of the casing by means of a falsifying element such as a blade, a reflecting blade, or a magnet, because the detection device of the disclosure reacts to a motion of the facade which cannot be avoided when trying to open the casing.

Furthermore, a complete pull-off of the casing may also be detected thanks to the disclosure, because such a pull-off will automatically result in an acceleration motion (pull-off) and/or in an inclination of the casing which will be automatically detected by the detection device.

According to one feature, the detection device includes an accelerometer, in particular a three-dimensional type accelerometer.

The accelerometer has the advantage of allowing for a reliable detection of both the tilting motion of the facade during the opening of the casing, and of the inclined position of the facade required for the removal of the facade, and avoiding false detections, for example, subsequently to an impact against the reader.

Alternatively or complementarily, the detection device includes a gyroscope.

According to another feature, the complementary guiding means include at least one receiving notch cooperating with a guide pin engaged in said receiving notch in the closed configuration, the or each guide pin presenting a guide ramp inclined with respect to the main wall of the base in the closed configuration, and the or each guide pin being carried by the facade or the base and the or each receiving notch being provided inversely on the base or the facade.

Thus, these guiding means with notch(es) and pin(s) form a mechanical means for hooking the facade on the base which, because of the ramp, makes the tilting motion and the inclination of the facade mandatory when opening the casing.

Preferably, the complementary guiding means include at least two receiving notches each cooperating with a guide pin.

In a particular embodiment, the complementary guiding means include at least one guide rail cooperating with a bearing element gliding along said rail during the opening of the casing, the or each guide rail presenting a guide ramp inclined with respect to the main wall of the base in the closed configuration, and the or each guide rail being carried by the facade or the base and the or each bearing element being carried inversely by the base or the facade.

Thus, these guiding means with rail(s) and bearing element(s) mechanically guide the facade in the desired tilting motion.

Preferably, the complementary guiding means include at least two guide rails each cooperating with a bearing element.

Advantageously, the or each guide rail presents an arched shape for pivotally guiding the facade during the opening of the casing.

In a particular embodiment, the or each bearing element presents a bearing surface arched against the guide rail, in order to establish an extended contact between the or each bearing element and the corresponding guide rail in the closed configuration.

Such an extended (and non-point) contact allows guaranteeing a stable holding of the facade on the base, and especially it allows that, when the casing is open by pulling on the facade, the or each bearing element rubs against the guide rail and the person who is opening the casing pulls strongly enough to overcome this resistance, until this contact is broken (beyond a determined angle of inclination of the facade) and then the person abruptly pulls on the released facade, which is reflected in a high acceleration of the facade which is easily detectable by the detection device.

According to one possibility of the disclosure, the or each bearing element is provided on a wall delimiting a receiving notch.

Thus, the complementary guiding means with notch(es) and pin(s) are adjacent to the complementary guiding means with rail(s) and bearing element(s), thereby improving the guiding of the facade.

According to another possibility of the disclosure, the complementary guiding means are disposed in a symmetrical manner with respect to a midplane of the casing.

In accordance with another advantageous feature of the disclosure, the complementary guiding means are provided on upper or lower portions of the base and of the facade.

Thus, the facade pivots upwards (if the guiding means are provided on the upper portions of the base and of the facade) or downwards (if the guiding means are provided on the lower portions of the base and of the facade).

Advantageously, the reader comprises other complementary guiding means shaped to guide the facade in a tilting motion relative to the base when opening the casing, said other complementary guiding means being provided on lateral rims of the base and of the facade.

Such complementary guiding means come in complement to the guiding means provided on the upper or lower portions of the base and of the facade, in order to enhance the guidance.

The present disclosure also concerns a feature according to which the other complementary guiding means include at least one glider cooperating with a bearing part gliding along said glider when opening the casing, the or each glider presenting a guide ramp inclined with respect to the main wall of the base in the closed configuration, the or each glider being carried by a lateral rim of the facade or of the base and the or each bearing part being carried inversely by a lateral rim of the base or of the facade.

According to one possibility of the disclosure, the angle of inclination of the facade with respect to the main wall in the open configuration is comprised between 5 and 20°, this angle being imposed by the complementary guiding means.

BRIEF DESCRIPTION OF THE DRAWINGS

Other features and advantages of the present disclosure will appear upon reading the detailed description hereinafter, of a non-limiting embodiment, made with reference to the appended figures in which:

FIGS. 3 and 4 are front and side schematic perspective views of the casing of FIG. 1 in the open configuration;

FIG. 5 is a side schematic view of the casing of FIG. 1 in the removal configuration of the facade, the façade being fully disengaged from the base;

FIG. 6 is a back schematic perspective view of the casing of FIG. 1 in the open configuration, with a zoom on an encircled area;

DETAILED DESCRIPTION OF THE DRAWINGS

Figure 1:
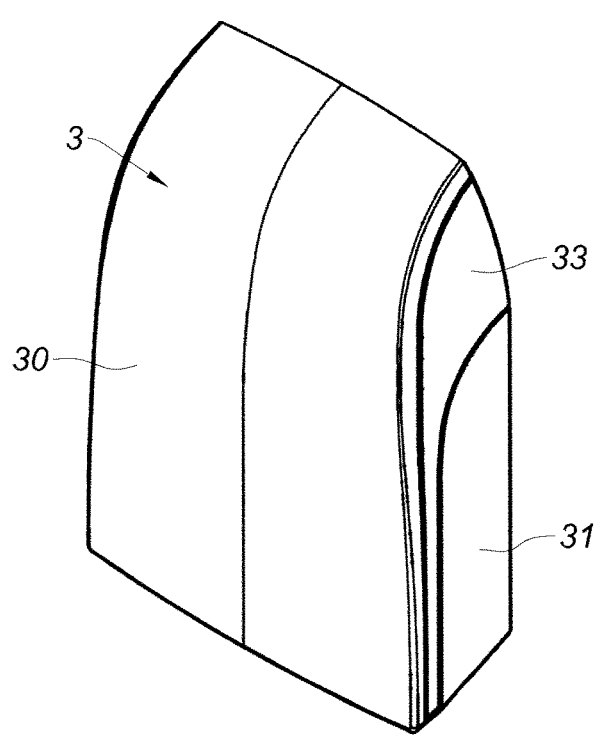
FIGS. 1 and 2 are front and side schematic perspective views of the casing of an example of a reader in accordance with the disclosure in the closed configuration.
Figure 2:
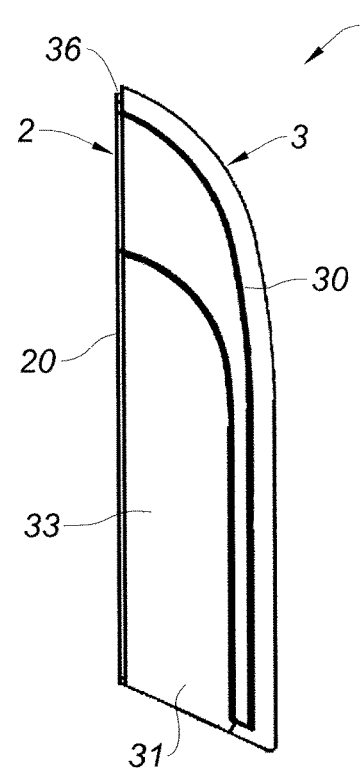
Figure 3:
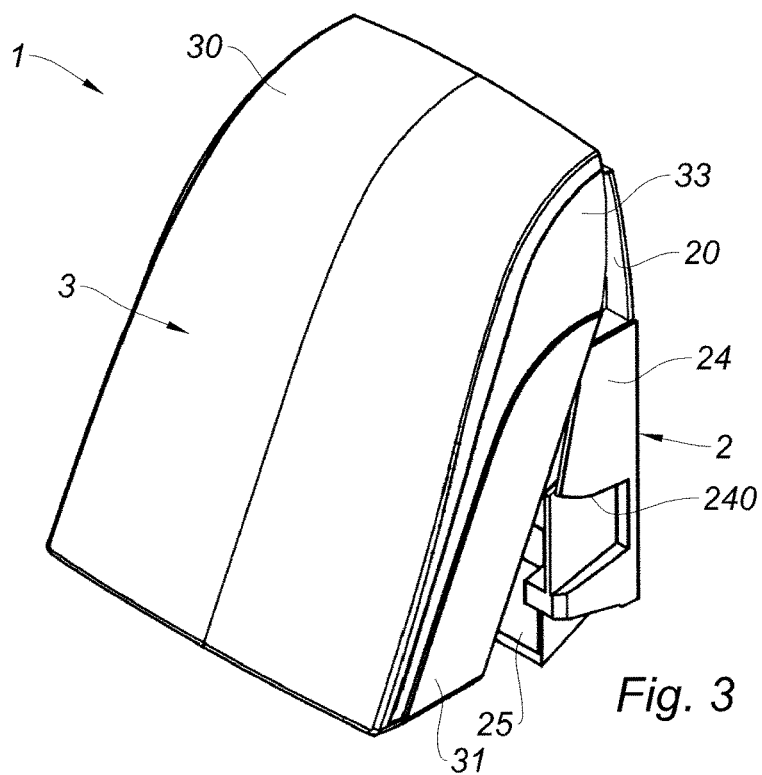
Figure 7:
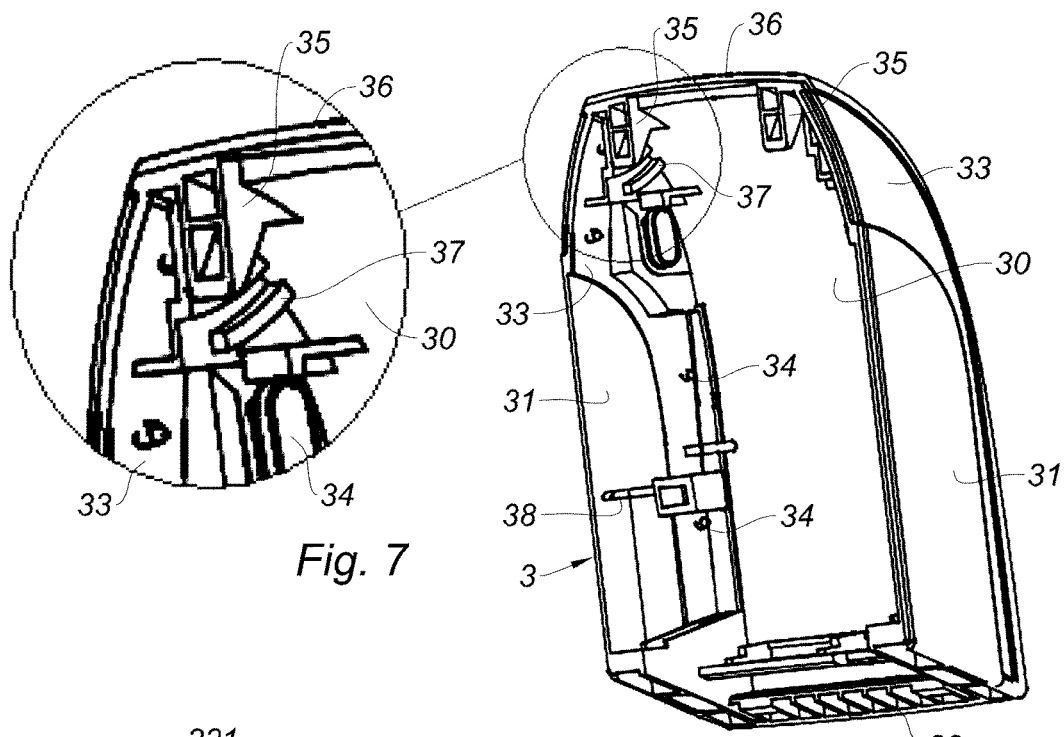
FIG. 7 is a back schematic perspective view of the facade of the casing of FIG. 1, with a zoom on a circle area.
Figure 8:
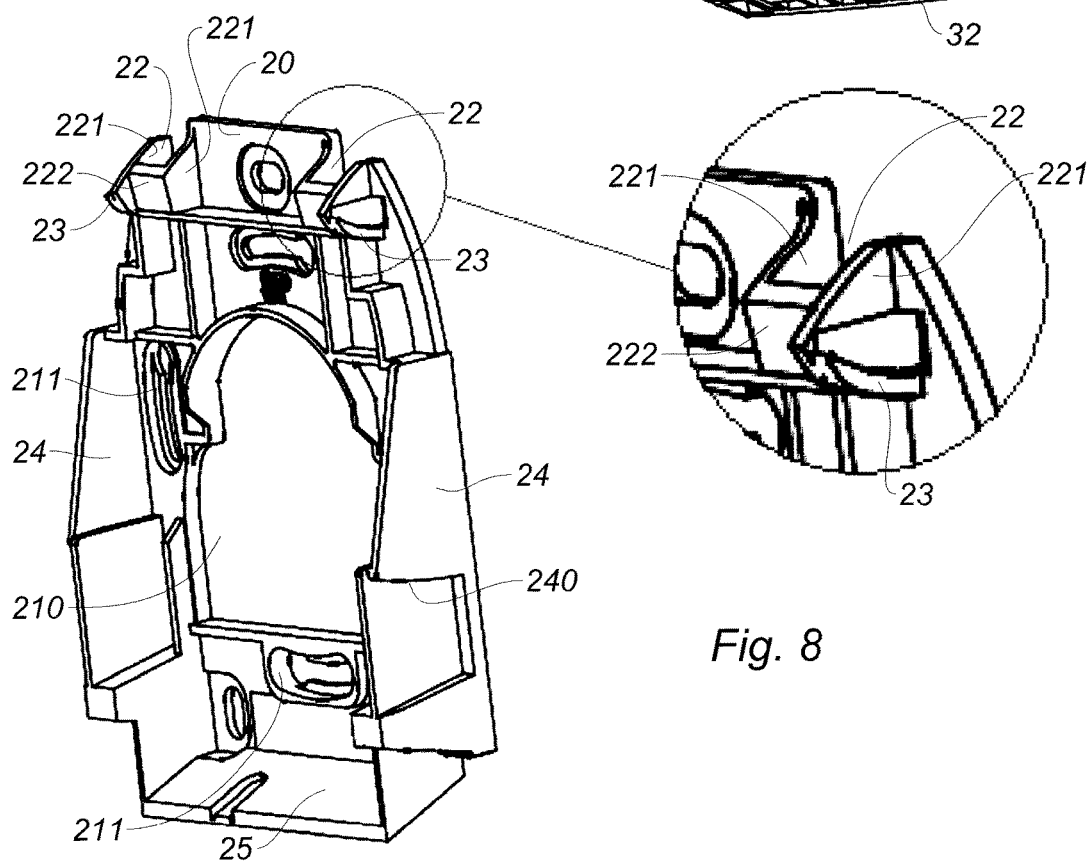
FIG. 8 is a front schematic perspective view of the base of the casing of FIG. 1, with a zoom on an encircled area.

Referring to the figures, the reader in accordance with the disclosure includes a casing 1 composed of two portions: a base 2 provided for a fixation on a vertical support (not illustrated), generally a wall or a partition wall, and a facade 3 mounted on the base 2. Once the facade 3 is mounted on the base 2, the casing 1 delimits internally an enclosed space inside which are disposed the electronics used for the identification and access control, in particular with technologies of the type RFID, keyboard, biometric device, etc.; the present disclosure not being limited to the identification technologies implemented by the reader inside of the casing 1.

The base 2 includes a wall called planar main wall 20 which bears against the support in order to be fastened thereto. This planar wall 20 presents a central opening 210 for the passage of cables (not illustrated) and preferably oblong shaped orifices 211, for the passage of screws (not illustrated) for fastening the base 2 on the support. The main wall 20 presents an inner face facing the facade 3 once the casing 1 is mounted, and an outer face opposite the inner face, where said outer face bears against the support once the base 2 is fastened on the support.

The base 2 includes two notches 22 (called receiving notches) protruding from the inner face of the main wall 20, in other words delimited by protruding walls of said inner face. These notches 22 are provided on an upper portion of the base 2, which will be located at the top once the casing 1 is in situation. The notches 22 are delimited by a horizontal bottom 220, two vertical lateral walls 221 and a front wall 222 inclined with respect to the main wall 20.

The base 2 also includes two bearing elements 23 made in the form of arc-shaped rails and protruding from the two respective lateral walls 221 located on the outside. Each rail 23 forms a ramp which rises starting from the main wall 20 up to the free end of the rail 23. Each rail 23 presents a lower bearing surface intended to bear against the corresponding rail 37 of the facade 3 described hereinafter.

The base 2 also includes two lateral rims 24 facing each other, which protrude from the inner face of the main wall 20 and which are perpendicular to the main wall 20. The base 2 presents two gliders 240 arranged on the respective outer faces of the two lateral rims 24. Each glider 240 is arc-shaped and defines a guide ramp which rises starting from the main wall 20 up to the free edge of the corresponding lateral rim 24. Each glider 240 is presented as the upper edge of a slot arranged in the corresponding lateral rim 24.

The base 2 further includes a lower rim 25 also protruding from the inner face of the main wall 20, and which is provided on a lower portion of the base 2, which will be located to the bottom once the casing 1 is in situation, this lower rim 25 linking the two lateral rims 24.

The facade 3 includes a front curved main wall 30 which faces the main wall 20 of the base 2 in situation. The main wall 30 is prolonged, on the one hand, on the sides by lateral rims 31 which cover the lateral rims 24 of the base 2 in situation and, on the other hand, on the underside by a lower rim 32 which is in alignment with the lower rim 25 of the base 2 in situation.

The facade 3 also includes two transparent or translucent windows 33 which are mounted on the respective lateral rims 31, so that light emitters (not illustrated) integrated to the reader and placed on the lateral sides of the casing 1 could emit a visible light through these windows 33. More specifically, the light emitters, in particular of the light-emitting diode type, are mounted on the lateral rims 31 of the facade 3 in receiving orifices 34 disposed under the windows 33. The windows 33 may extend over almost the entire height of the lateral rims 31.

The main wall 30 presents an inner face facing the base 2 once the casing 1 is mounted, and an outer face opposite to the inner face, where said outer face is visible and forms the identification or reading area for the reader (keyboard area, badge reading area, etc.) depending on the identification technology(ies) retained for the reader.

The facade 3 includes two pins 35 (called guide pins) protruding downwards from the inner face of the main wall 30, and more specifically protruding from the upper rim 36 of the main wall 30. Each pin 35 presents a guide ramp 350 inclined with respect to the vertical and facing the main wall 30. Each pin 35 cooperates with a notch 22 of the base 2, by engaging inside the latter, each pin 35 forming a hook which is positioned in the corresponding notch 22.

Figure 9:
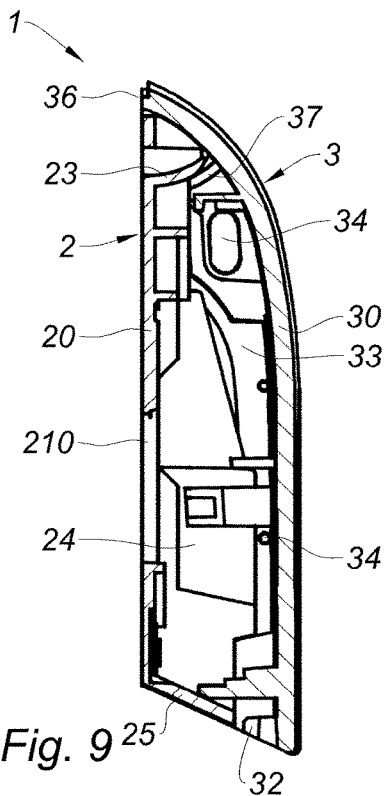
FIGS. 9 and 10 are cross-sectional views, along a first cross-sectional plane, of the casing of FIG. 1, respectively in the closed and open configuration.
Figure 10:
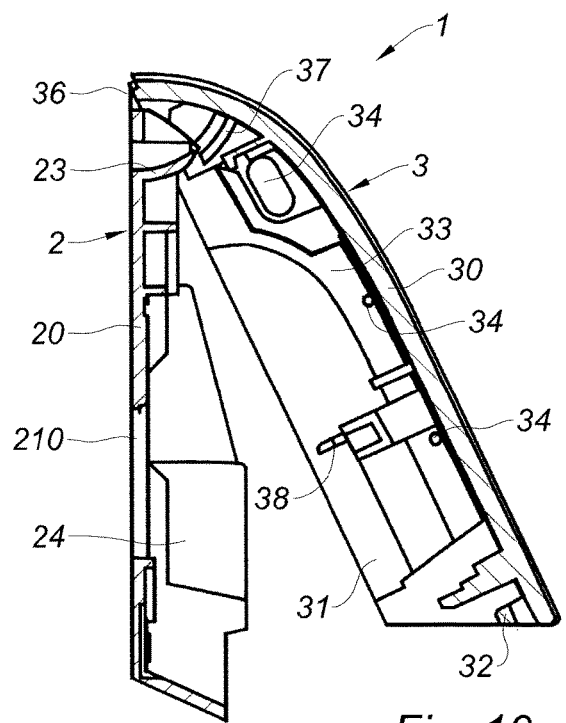
Figure 11:
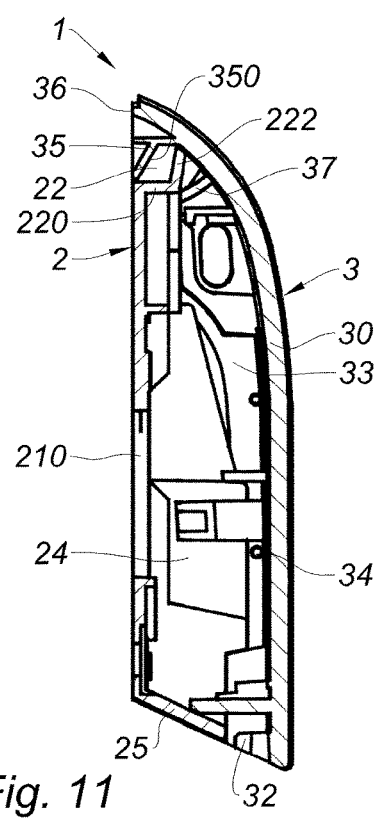
FIGS. 11 and 12 are cross-sectional views, along a second cross-sectional plane, of the casing of FIG. 1, respectively in the closed and open configuration.
Figure 12:
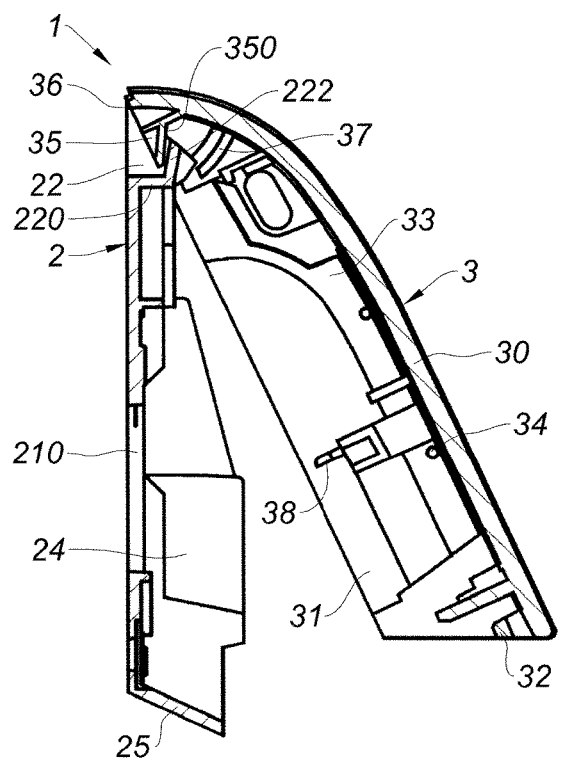

The facade 3 includes two arc-shaped guide rails 37 protruding from the inner face of the main wall 30 and each forming a ramp which descends starting from the main wall 30 down to the free end of the rail 37. Each rail 37 delimits a glider and the rails 27 are disposed in the proximity of the pins 35. Each rail 37 of the facade 3 cooperates with a rail 23 of the base 2, each rail 23 engaging in the glider provided above the corresponding rail 37 while bearing against the rail 37. As can be seen in FIG. 9, the rail 23 and the rail 37 establish an extended or non-point contact.

The facade 3 also includes two bearing parts 38 made in the form of rails protruding from the inner faces of the lateral rims 31. These rails 38 cooperate with the gliders 240 provided on the respective lateral rims 24 of the base 2.

In situation, when mounting the facade 3 on the base 2 (in other words, when closing the casing 1), the pins 35 are first engaged in the notches 22 with the facade 3 inclined with respect to the vertical main wall 20 at a non-zero angle A, in particular in the order of 5 to 20° (as illustrated in FIGS. 3, 4, 6, 10 and 12), then, the facade 3 is pivoted until the rails 37 glide against the rails 23 then the rails 38 glide against the glider 240, and finally until the facade 3 completely bears against the base 2 so as to close the casing (as illustrated in FIGS. 1, 2, 9 and 11). Fastening the facade 3 on the base 2 is completed by one or several fastening screws, preferably tamperproof type screws, which passes through the facade 3, in particular its lower rim 32, and is screwed on the base 2. To this end, each of the base 2 and the facade 3 presents at least one orifice for the passage of a fastening screw, preferably at the lower portion (namely on the underside of the casing 1) for aesthetic reasons.

In situation, when removing the facade 3 from the base 2 (in other words, when opening the casing 1, and of course after having removed the fastening screw(s)), the bottom of the facade 3 is pulled on in order to make the facade 3 pivot upwards, this pivoting motion being guided by the rails 37 gliding against the rails 23 and the rails 38 gliding against the glider 240 and imposed by the pins 35 engaged in the notches 22, until the facade 3 is spaced away from the base 2 and inclined with respect to the vertical main wall 20 at a non-zero angle A, in particular in the order of 5 to 20° (as illustrated in FIGS. 3, 4, 6, 10 and 12). Afterwards, we only need to raise the facade 3 upwards so as to completely remove the facade 3 (as illustrated in FIG. 5).

In accordance with the disclosure, an accelerometer type detection device (not illustrated) is fastened on the facade 3, and more particularly inside of the casing 1, for detecting the tilting or pivoting motion of the facade 3 when the latter is removed according to the above-described motion.

For example, this accelerometer is placed on an electronic board (not illustrated) which integrates the components required for the operation of the reader and which is mounted on the facade 3 (inside of the casing 1).

The accelerometer is connected to a control unit, in particular a microprocessor type control unit, which receives measurement data from the accelerometer, processes these measurement data, and determines (by applying a specific algorithm) whether the measurement data translates a pull-off or opening situation of the casing, then implements an alarm procedure comprising for example sending an alarm signal and/or disconnecting the reader in order to make it unusable and/or erasing memorized data such as authentication keys.

Of course, the example of implementation mentioned above is in no way limiting and other improvements and details may be brought to the reader according to the disclosure, without departing from the scope of the disclosure where other identification technologies may be for example considered for the reader.

The invention claimed is:

1. An access control reader comprising:
   a casing integrating a base presenting a main wall provided for a fixation on a support and a facade mounted on said base, and
   a detection device for detecting an opening of the casing, wherein the base and the facade include complementary guides shaped to guide the facade in a tilting motion relative to the base when opening the casing starting from a closed configuration in which the facade is fastened and folded over the base up to an open configuration in which the facade is spaced away from the base and is inclined with respect to the main wall at a predefined non-zero angle, and
   wherein the detection device is mounted on the facade so as to detect the tilting motion of said facade.

2. The access control reader according to claim 1, wherein the detection device includes an accelerometer.

3. The access control reader according to claim 1, wherein the complementary guides include at least one receiving notch cooperating with a guide pin engaged in said receiving notch in the closed configuration, the guide pin presenting a guide ramp inclined with respect to the main wall of the base in the closed configuration, and the guide pin being carried by the facade or the base and the receiving notch being provided inversely on the base or the facade.

4. The access control reader according to claim 1, wherein the complementary guides include at least one guide rail cooperating with a bearing element gliding along said guide rail when opening the casing, the guide rail presenting a guide ramp inclined with respect to the main wall of the base in the closed configuration, and the guide rail being carried by the facade or the base and the bearing element being carried inversely by the base or the facade.

5. The access control reader according to claim 4, wherein the guide rail presents an arched shape for pivotally guiding the facade when opening the casing.

6. The access control reader according to claim 5, wherein the bearing element presents a bearing surface arched against the guide rail, in order to establish an extended contact between the bearing element and the corresponding guide rail in the closed configuration.

7. The access control reader according to claim 4, wherein the complementary guides include at least one receiving notch cooperating with a guide pin engaged in said receiving notch in the closed configuration, the guide pin presenting a guide ramp inclined with respect to the main wall of the base in the closed configuration, and the guide pin being carried by the façade or the base and the receiving notch being provided inversely on the base or the façade, and wherein the bearing element is provided on a wall delimiting the receiving notch.

8. The access control reader according to claim 1, wherein the complementary guides are disposed in a symmetrical manner with respect to a midplane of the casing.

9. The access control reader according to claim 1, wherein the complementary guides are provided on upper or lower portions of the base and of the facade.

10. The access control reader according to claim 9, comprising other guides shaped so as to guide the facade in a tilting motion relative to the base during the opening of the casing, said other complementary guides being provided on lateral rims of the base and of the facade.

11. The access control reader according to claim 10, wherein the other complementary guides include at least one glider cooperating with a bearing part gliding along said glider during the opening of the casing, the glider presenting a guide ramp inclined with respect to the main wall of the base in the closed configuration, the glider being carried by the lateral rim of the facade or of the base and the bearing part being carried inversely by the lateral rim of the base or of the facade.

12. The access control reader according to claim 1, wherein the predefined non-zero angle which is an angle of inclination of the facade with respect to the main wall in the open configuration is between 5° and 20°.

13. The access control reader according to claim 1, wherein the detection device includes a three-dimensional type accelerometer.

* * * * *